United States Patent
Chekhovstov et al.

(10) Patent No.: US 8,542,766 B2
(45) Date of Patent: Sep. 24, 2013

(54) TIME ALIGNMENT ALGORITHM FOR TRANSMITTERS WITH EER/ET AMPLIFIERS AND OTHERS

(75) Inventors: Igor Chekhovstov, Friendswood, TX (US); Khalil Haddad, Allen, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 96 days.

(21) Appl. No.: 13/097,844

(22) Filed: Apr. 29, 2011

(65) Prior Publication Data

US 2011/0274210 A1 Nov. 10, 2011

Related U.S. Application Data

(60) Provisional application No. 61/331,267, filed on May 4, 2010.

(51) Int. Cl.
*H04K 1/02* (2006.01)
(52) U.S. Cl.
USPC .......................... 375/296; 704/223; 708/316
(58) Field of Classification Search
USPC ......................................... 375/296; 704/223
See application file for complete search history.

(56) References Cited

U.S. PATENT DOCUMENTS

| | | | | | |
|---|---|---|---|---|---|
| 5,664,055 | A | * | 9/1997 | Kroon | 704/223 |
| 5,699,485 | A | * | 12/1997 | Shoham | 704/223 |
| 5,732,389 | A | * | 3/1998 | Kroon et al. | 704/223 |
| 5,742,532 | A | * | 4/1998 | Van Duyne et al. | 708/313 |
| 5,781,461 | A | * | 7/1998 | Jaffe et al. | 708/301 |
| 6,104,992 | A | * | 8/2000 | Gao et al. | 704/220 |
| 6,480,822 | B2 | * | 11/2002 | Thyssen | 704/220 |
| 6,591,283 | B1 | * | 7/2003 | Conway et al. | 708/316 |
| 2001/0023395 | A1 | * | 9/2001 | Su et al. | 704/220 |
| 2002/0150128 | A1 | * | 10/2002 | Mohseni et al. | 370/535 |
| 2008/0167558 | A1 | * | 7/2008 | Song et al. | 600/447 |
| 2011/0156815 | A1 | * | 6/2011 | Kim et al. | 330/149 |

* cited by examiner

*Primary Examiner* — Leon-Viet Nguyen
*Assistant Examiner* — Sarah Hassan
(74) *Attorney, Agent, or Firm* — Jefferson IP Law, LLP

(57) ABSTRACT

An apparatus and method for aligning input and feedback signals in a transmission circuit are provided. The method includes capturing an input signal and a feedback signal, determining a first time delay between the input signal and the feedback signal, determining a second time delay between the input signal and the feedback signal, the determination of the second time delay having a higher resolution than the determination of the first time delay, and applying the first time delay and the second time delay to temporally align the input signal with the feedback signal. Use of the present invention provides an improved resolution of time alignment while reducing the overall complexity and cost of the transmission circuit.

12 Claims, 6 Drawing Sheets

US 8,542,766 B2

TIME ALIGNMENT ALGORITHM FOR TRANSMITTERS WITH EER/ET AMPLIFIERS AND OTHERS

CROSS-REFERENCE TO RELATED APPLICATION

This application claims the benefit under 35 U.S.C. §119(e) of a U.S. Provisional application filed on May 4, 2010 in the U.S. Patent and Trademark Office and assigned Ser. No. 61/331,267, the entire disclosure of which is hereby incorporated by reference.

BACKGROUND OF THE INVENTION

1. Field of the Invention

The present invention relates to an apparatus and method for amplifying a communication signal. More particularly, the present invention relates to an apparatus and method for improving the time alignment of signals used for amplifying a signal while reducing overall complexity.

2. Description of the Related Art

Portable terminals, which typically include a battery powered device that allows a user to wirelessly communicate with others, are used extensively in modern society. In this case, a portable terminal denotes not only any mobile unit that is typically carried by a user, but also a base station and other components that support the portable terminal. As the portable terminal continues to gain popularity, manufacturers continue to seek new ways in which to improve their product. One aspect to improve a portable terminal is to reduce its size and weight, thus making it more convenient to carry. Another aspect is to provide advanced features. However, reductions in size and weight are often limited by the power requirements necessary to provide the advanced features. That is, to supply the necessary power required for processing and supporting of the advanced features, the battery of the portable terminal must be adequately sized to ensure sufficient capacity for a reasonable amount of time. Thus, a reduction in the size of the portable terminal, due to the necessary size of the battery, is difficult to obtain.

Another consideration in battery sizing, and in power use in general, is the amount of power necessary to transmit a wireless signal. For transmission of the wireless signal, the portable terminal uses a Radio Frequency (RF) transmitter that includes a Power Amplifier (PA). The PA is used to amplify signals for outputting by the portable terminal's antenna. To maximize the efficiency of the PA, it is operated in its non-linear region, near saturation. However, due to the non-linearity of the PA, the Adjacent Channel Leakage Ratio (ACLR) becomes unacceptable since the output spectrum will expand and cause interference with adjacent transmission channels. To address this problem, an amplifier linearization technique may be performed by employing an adaptive Digital Pre-Distorter (DPD) to pre-process the baseband signal that is input into the PA so that the PA output behaves linearly.

FIG. 1 is a block diagram of a transmitter according to the prior art.

Referring to FIG. 1, the transmitter 100 includes a DPD 101, an envelope modulator 103, a Digital-to-Analog Converter (DAC) 105, an up-converter 107, a PA 109, an output unit 111, a down-converter 113, an Analog-to-Digital Converter (ADC) 115, and a Digital Signal Processor (DSP) 117.

The DPD 101 receives a baseband signal to be transmitted. The DPD 101 operates by pre-distorting the baseband signal. Combining the DPD 101 and the PA 109 will provide a substantially linear system since the DPD 101 acts as the inverse model of the PA 109.

The signal distorted by the DPD 101 is provided to the DAC 105 for conversion from a digital to an analog signal. The analog signal output from the DAC 105 is provided to the up-converter 107 for up-conversion and then provided to the PA 109 for amplification. The envelope modulator 103 is provided when Envelope Elimination and Restoration (EER) and Envelope Tracking (ET) type amplifiers are being used, otherwise there is no need for the envelope modulator 103 and no need for envelope time alignment between points D and C. In this case, only loop time alignment is needed between points A and B.

The signal amplified by the PA 109 is output to the output unit 111. Though not illustrated, the output unit 111 may include an antenna, a multiplexer, and the like for outputting and receiving signals. The signal output by the PA 109 is also fed back to the down-converter 113 which provides the down-converted signal to the ADC 115. The ADC 115 converts the down-converted analog signal to a digital signal and provides the digital feedback signal to the DSP 117 for processing.

To compute and constantly update the pre-distortion value provided by the DPD 101, the DSP 117 needs to capture two signals: the transmitted baseband or reference signal and the PA output or feedback signal. In addition, the reference and the feedback signals, illustrated respectively as points A and B in FIG. 1, must be time aligned with very high accuracy. That is, since the feedback signal is a delayed version of the input signal, the time delay between these two signals (i.e., the loopback delay) has to be estimated with very high accuracy in order to properly apply the pre-distortion. The transmitted baseband signal is digital prior to analog conversion by the DAC 105. Accordingly, processing of the baseband signal presents few problems for the DSP 117. However, the feedback signal supplied by the output unit 111 is initially in analog form. Thus, the feedback signal first needs to be down-converted by the down-converter 113 and converted to digital form by the ADC 115 before it can be processed by the DSP 117. This down-conversion and digitization, as well as the processes performed by the DAC 105, the up-converter 107, and the PA 109, are of significance because each process not only delays the feedback signal, but the delay may vary based on factors such as temperature, and the like.

Moreover, because the transmitter 100 of FIG. 1 employs the envelope modulator 103 to implement the ET or EER technique, an additional time alignment is required between an envelope signal output by the envelope modulator 103 and the up-converted baseband or loopback signal output by the up-converter 107. This envelope delay is illustrated in FIG. 1 as the delay between points C and D. This delay needs to be estimated in order to time align the signals with even higher accuracy than the loopback time alignment. That is, without high precision time envelope and loopback signal alignment respectively at points C and D and points A and B, the DSP 117 will not be able to compute the proper parameters for the DPD needed to linearize the amplifier.

Time alignment in the prior art consists mainly of oversampling the signals and applying a cross-correlation technique. For example, in the transmitter illustrated in FIG. 1, the baseband and feedback signals at points A and B are oversampled and analyzed by a cross-correlation technique in order to determine the delay between the two signals. Other techniques may include some type of Time Delay Estimation (TDE) in a closed loop fashion.

In the prior art, in order to achieve a high accuracy time alignment with a resolution $\frac{1}{20}$ of a sample or better, the acquired signals must be over-sampled. Over-sampling is required prior to the cross-correlation operation in order to increase the accuracy of the time alignment. Typically, an over-sampling of 10 to 20 times is necessary to achieve sufficient results. However, because such a large over-sampling is required and because the cross-correlation techniques are mathematically intensive, these operations require a large amount memory and a powerful DSP, which increase the overall cost of the portable terminal. Moreover, such extensive computations and memory operations require power that must be supplied from the battery, which in turn limits the ability to reduce the battery size. All of these factors make it impractical, from the point of view of implementation and cost, to provide an adequate time alignment.

Another problem with these techniques is the difficulty in finding an optimum delay when using the computed cross-correlation. That is, determining the peak of a cross-correlation curve does not necessarily produce an optimum time delay estimation due to the analog noise and non-linear distortion of the feedback signal when such techniques are implemented. Moreover, the over-sampling by up to 20 times may not be enough to provide consistent results, which in turn leads to an inferior quality of linearization. Even further, it is very difficult to implement the scheme of over-sampling the signal followed by a cross-correlation operation in a Field Programmable Gate Array (FPGA) due to the limitation of the FPGA clock speed and memory. Therefore, because these techniques are not suited for fast, real time tracking of the time delay in order to make the proper time alignment, a need exists for an improved apparatus and method for providing improved time alignment in a transmitter.

SUMMARY OF THE INVENTION

Aspects of the present invention are to address at least the above-mentioned problems and/or disadvantages and to provide at least the advantages described below. Accordingly, an aspect of the present invention is to provide an apparatus and method for providing an improved time alignment method in a transmitter.

Another aspect of the present invention is to provide an apparatus and method for time aligning signals that does not require over-sampling of the signals.

Still another aspect of the present invention is to provide an apparatus and method for improving the accuracy of time aligning signals that are used for computation of the Digital Pre-Distorter (DPD) parameters needed to linearize the power amplifier.

Yet another aspect of the present invention is to provide an apparatus and method having a reduced complexity.

In accordance with an aspect of the present invention, a method for providing a user interface in a portable terminal having a software mode and a hardware mode is provided. The method includes capturing an input signal and a feedback signal, determining a first time delay between the input signal and the feedback signal, determining a second time delay between the input signal and the feedback signal, the determination of the second time delay having a higher resolution than the determination of the first time delay, and applying the first time delay and the second time delay to temporally align the input signal with the feedback signal.

In accordance with another aspect of the present invention, an apparatus for providing a user interface in a portable terminal having a software mode and a hardware mode is provided. The apparatus includes a controller for capturing an input signal and a feedback signal, for determining a first time delay between the input signal and the feedback signal, and for determining a second time delay between the input signal and the feedback signal, the determination of the second time delay having a higher resolution than the determination of the first time delay, a first integer delay for applying the first time delay, and a first fractional delay for applying the second time delay, wherein the first integer delay and the first fractional delay respectively apply the first time delay and the second time delay to temporally align the input signal with the feedback signal.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, like reference numerals will be understood to refer to like parts, components, and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Exemplary embodiments of the present invention as described below relate to an apparatus and method for amplifying a transmission signal. More specifically, exemplary embodiments of the present invention provide an apparatus and method that improve the time alignment of signals used by a power amplifier operating in its non-linear range in order to efficiently output a linear signal. Furthermore, exemplary embodiments of the present invention provide an apparatus and method for providing the improved time alignment while reducing the complexity of both the process and the device necessary to achieve such improvement.

Figure 1:
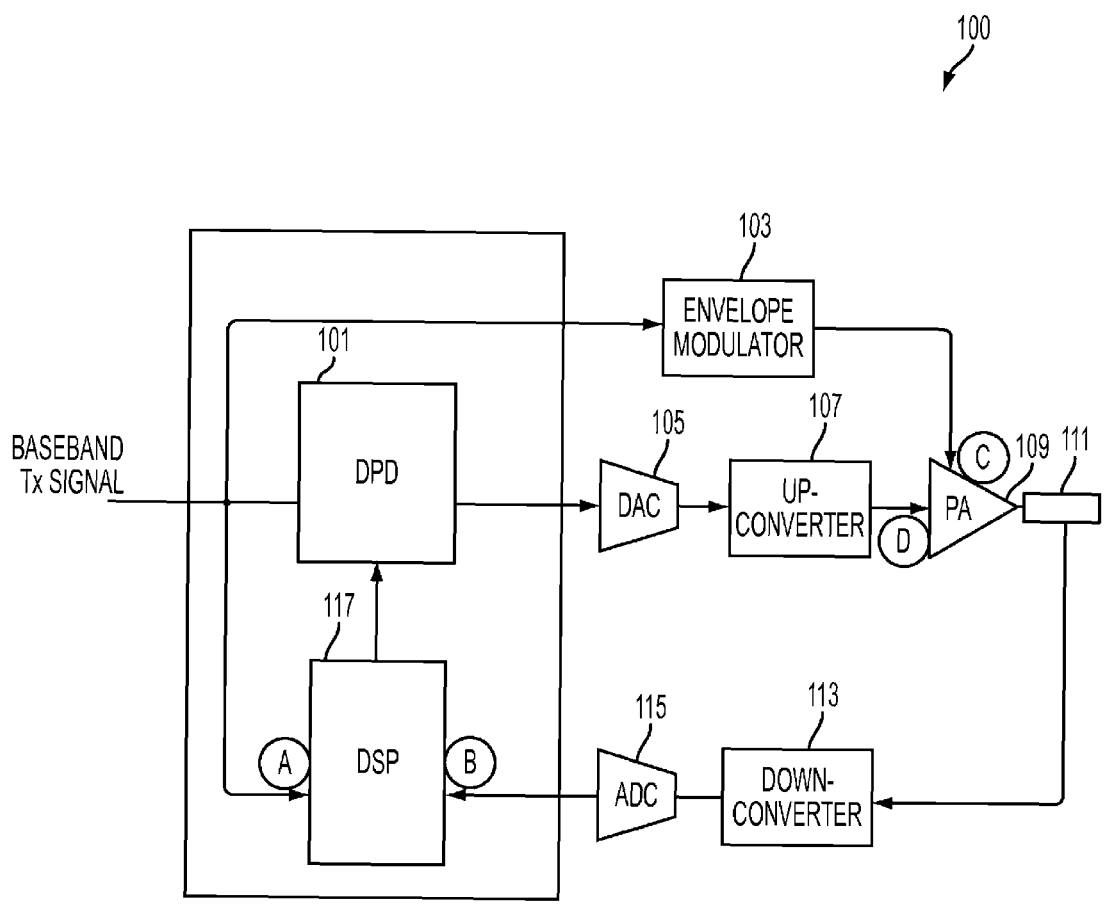
FIG. 1 is a block diagram of a transmitter according to the prior art.
Figure 2:
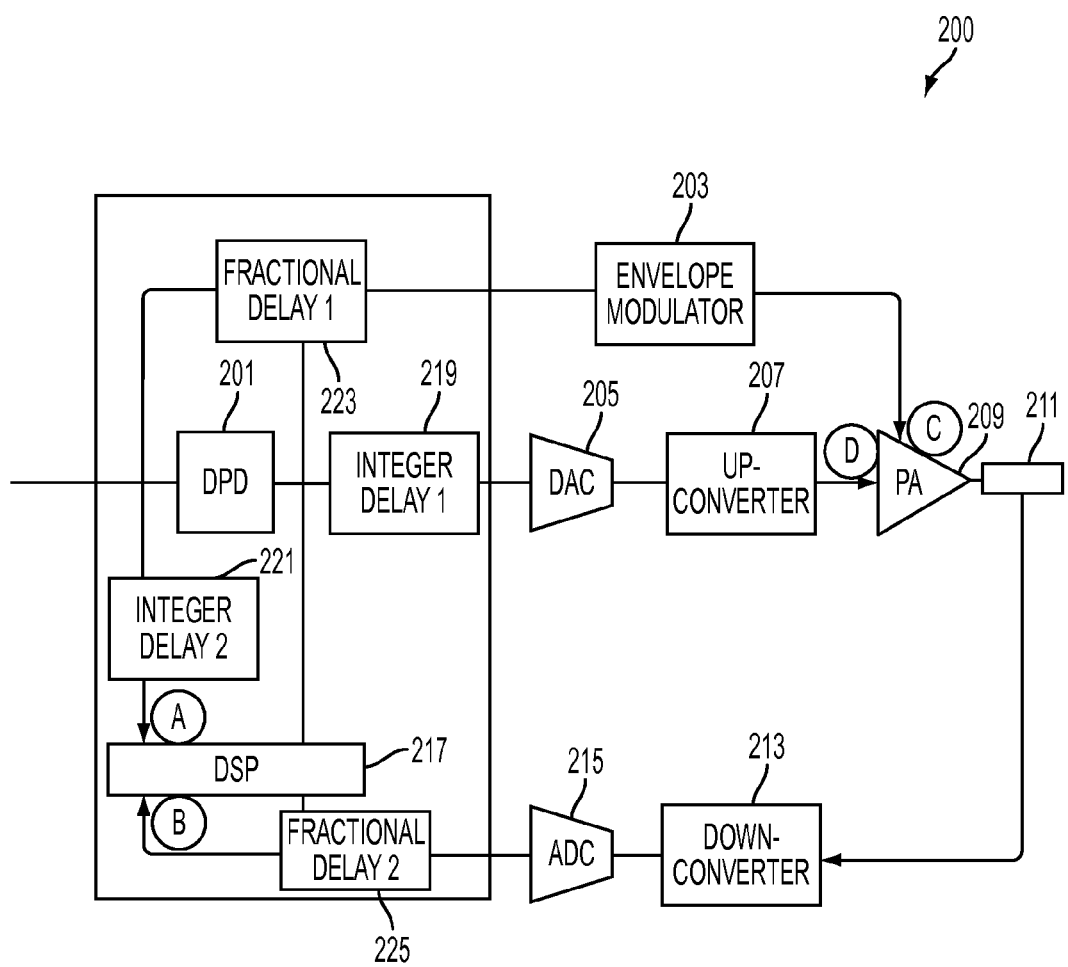
FIG. 2 is a block diagram of a transmitter according to an exemplary embodiment of the present invention.

FIG. 2 is a block diagram of a transmitter according to an exemplary embodiment of the present invention.

Referring to FIG. 2, a transmitter 200 includes a Digital Pre-Decoder (DPD) 201, an envelope modulator 203, a Digital-to-Analog Converter (DAC) 205, an up-converter 207, a Power Amplifier (PA) 209, an output unit 211, a down-converter 213, an Analog-to-Digital Converter (ADC) 215, a Digital Signal Processor (DSP) 217, a first integer delay 219, a second integer delay 221, a first fractional delay 223, and a second fractional delay 225.

The DPD 201 is provided to supply a pre-distortion value so that the input baseband signal can be linearly amplified. In implementation, the pre-distortion value may be the approximate inverse of the distortion produced by the PA 209. The envelope modulator 203 is provided if the PA 209 is of a type such as an Envelope Elimination and Restoration (EER) or Envelope Tracking (ET). The DAC 205 converts a digital input signal to analog form and provides the analog signal to the up-converter 207 for up-conversion. The up-converted analog signal from the up-converter 207 is supplied to the PA 209 for amplification and the amplified signal is provided to the output unit 211 for transmission. Although not illustrated, the output unit 211 may include an antenna, a multiplexer, and the like for outputting and receiving signals. The output unit 211 also provides a feedback signal via the down-converter 213 and the ADC 215.

The first integer delay 219 and the second integer delay 221, as well as the first fractional delay 223 and the second fractional delay 225 are provided as exemplary embodiments of the present invention. As illustrated in FIG. 2, the first integer delay 219 is provided intermediate to the DPD 201 and the DAC 205 while the first fractional delay 223 is provided to delay an input signal to the envelope modulator 203. However, this is not intended as a limitation on their locations. For example, the locations of the first integer delay 219 and the first fractional delay 223 may be switched such that the first fractional delay is intermediate the DPD 201 and the DAC 205 while the first integer delay 219 is provided to delay an input signal to the envelope modulator 203. As also illustrated in FIG. 2, the second integer delay 221 is provided to delay the baseband or reference signal provided to the DSP 217 and the second fractional delay 225 is implemented intermediate the ADC 215 and the DSP 217. However, as with the first integer delay 219 and the first fractional delay 223, this is not intended as a limitation on their locations. For example, the locations of the second integer delay 221 and the second fractional delay 225 may be switched such that the second integer delay 221 is intermediate the ADC 215 and the DSP 217 while the second fractional delay 225 is provided to delay the baseband or reference signal provided to the DSP 217.

In implementation, the DSP 217 captures two signals: a baseband transmission signal (i.e., the reference signal) and a feedback signal, which are respectively illustrated at points A and B in FIG. 2. Based on the data from these signals, the DSP 217 will compute a time value for the first integer (coarse) delay 219 between the reference signal and the feedback signal. Also based on the data from the reference signal and the feedback signal, the DSP 217 will compute a time value for the second integer (coarse) time delay 221 between the envelope signal and the forward path signal, which are respectively illustrated at points C and D in FIG. 2. The time values for the first and second integer delays 219 and 221 may be computed using well-known cross-correlation methods. Since these methods are known, they are not described here for convenience of description. Importantly however, the computations of the time values for the first and second integer delays 219 and 221 do not require over-sampling because the accuracy of cross-correlation without over-sampling has a resolution of one sample time. As described below, the accuracy resolution of one sample time is sufficient for the first and second integer delays 219 and 221 given the additional use of the first and second fractional delays 223 and 225.

After computation of the time values for the first and second integer delays 219 and 221, the DSP 217 will compute time values for the first and second fractional or fine delays 223 and 225. Proper computation of the time values for the first and second fractional delays 223 and 225, according to an exemplary embodiment of the present invention, provides a consistent time delay for optimum time alignment of the signals. Moreover, the proper computation of the time values for the first and second fractional delays 223 and 225 provides a time alignment that is not affected by noise.

In an exemplary implementation, each of the first and second fractional delays 223 and 225 includes a fractional delay filter that is used for very fine time alignment. More specifically, each of the first and second fractional delays 223 and 225 is implemented using a fractional delay filter selected from a set of fractional delay filters. Each set of fractional delay filters, which are used as filter banks, are stored in a memory or storage unit accessed by the DSP 217. In addition, the same set of filters is stored in the hardware (e.g., Field Programmable Gate Array (FPGA) memory). For each selected memory address in the FPGA, that is, for each filter selected from the set of filters by the DSP 217, a filter is loaded and used as a finite impulse filter (first and second fractional delays 223 and 225) to change the fractional delay accordingly. The number of different filters in the set of filters determines the fractional delay resolution. Accordingly, a greater number of filters in the set of filters provides for an increased fractional time delay resolution. In an exemplary implementation, if the number of filters in the set of filters is 64, this means that the time delay resolution is within 1/64 of a sample time. Of course, this number of filters is merely for example and not intended to limit the scope or applicability of the invention. Rather, the number of filters may vary depending on the required sensitivity of the transmitter, and especially depending on the required sensitivity for envelope time alignment, which, when implemented, typically requires a more sensitive time alignment for successful amplification in a non-linear power circuit.

To determine a time value for the first and second fractional delays 223 and 225, the DSP 217 will use the captured reference and feedback signals to compute a Measure of Error (ME) curve that represents the time alignment error. To compute the ME curve, the DSP 217 will use one of the algorithms that are described below. In an exemplary implementation, the ME curve is computed for the different fractional delay settings. In other words, the DSP 217 will compute N points of the ME curve by using N different fractional delay filters (i.e., computing one point for each different fractional delay filter). Changing fractional delay filters corresponds to changing the delay in the path of the signal. After the ME curve is built, the optimum solution is the minimum of the ME curve, which corresponds to the fractional delay filter that produces the optimum delay (i.e., the best time alignment between the appropriate two signals).

To find the proper setting of the first and second fractional delays 223 and 225 one of several methods may be used. According to a first exemplary method, the scanning may include all filters included in the filter set. For example, if the filter set includes N=64 filters, the scanning may be performed by using each of the 64 settings. That is, by computing a value for each of the 64 settings. By computing a value for each of the 64 settings, a minimum value from among the 64 resultant MEs can be determined with very high accuracy. According to a second exemplary method, a more efficient scanning algorithm that decreases the amount of computation may be used to find the minimum of the ME curve.

According to exemplary embodiments of the present invention, there are a plurality of algorithms available by which to compute the ME curves. Each algorithm includes benefits in support of its use. For example, certain algorithms are more accurate and immune to noise and signal gain variation than others. Alternatively, some algorithms require fewer computations to achieve a final result. Still others may provide more consistent and accurate results. Thus, implementation of one algorithm versus another may vary based on the individual requirements of each system.

In the following description, it is assumed that both the reference signal and feedback signal are complex and are respectively represented as $R(m)=(I_r(m), Q_r(m))$ and $F(m)=(I_f(m), Q_f(m))$, wherein a size of the data captured by the DSP 217 is represented as M. The following exemplary algorithms have shown to be robust against distortion noise. According to exemplary embodiments of the present invention, any one of them can be used to compute the ME curve for both the envelope and the loopback time alignment. Again however, some of them may suit one type of time alignment better than another, depending on various implementation schemes and other parameters of the transmitter. In each of the following examples, it is assumed that the number of filters N in the set of filters is 64 (i.e., N=64). Again, it is understood that this is merely for example and not by way of limitation.

$$\min_i ME(i) = \frac{\sum_{m=1}^{N}(R(m)F*(m))}{\sqrt{\left(\sum_{m=1}^{N}|R(m)|^2\right)\left(\sum_{m=1}^{N}|F(m)|^2\right)}} \text{ for } 1 \le i \le 64 \qquad \text{Algorithm 1}$$

$$\min_i ME(i) = \frac{\sum_{m=1}^{N}(R(m)F*(m))}{\left(\sum_{m=1}^{N}|R(m)|^2\right)\left(\sum_{m=1}^{N}|F(m)|^2\right)} \text{ for } 1 \le i \le 64 \qquad \text{Algorithm 2}$$

$$\min_i ME(i) = \sum_{m=1}^{N}(|I_r(m) - I_f(m)| + |Q_r(m) - Q_f(m)|) \text{ for } 1 \le i \le 64 \qquad \text{Algorithm 3}$$

$$\min_i ME(i) = \sum_{m=1}^{N}(||R(m)| - |F(m)||) \text{ for } 1 \le i \le 64 \qquad \text{Algorithm 4}$$

$$\min_i ME(i) = \sum_{m=1}^{N}(|\text{angle}(R(m)) - \text{angle}(F(m))|) \text{ for } 1 \le i \le 64 \qquad \text{Algorithm 5}$$

There are two strategies for computing the ME curve. For the first one and as described above, in an exemplary embodiment, the DSP 217 will capture new data and determine a value of an ME curve for each index (i). In the illustrated examples, the DSP 217 will capture new data for each of the 64 filters and determine the corresponding ME. In an alternative exemplary implementation, the DSP 217 may use a different algorithm wherein the value of ME is determined for a select number of the indexes. The index (i) that corresponds to the minimum ME is the memory address pointing to the optimum fractional delay filter (i.e., the fractional delay filter that produced the minimum of the ME curve). The optimum fractional delay filter is then used for optimum time delay adjustment. More specifically, each of the above algorithms will produce a plot having the shape of a bowl with one minimum.

Figure 3:
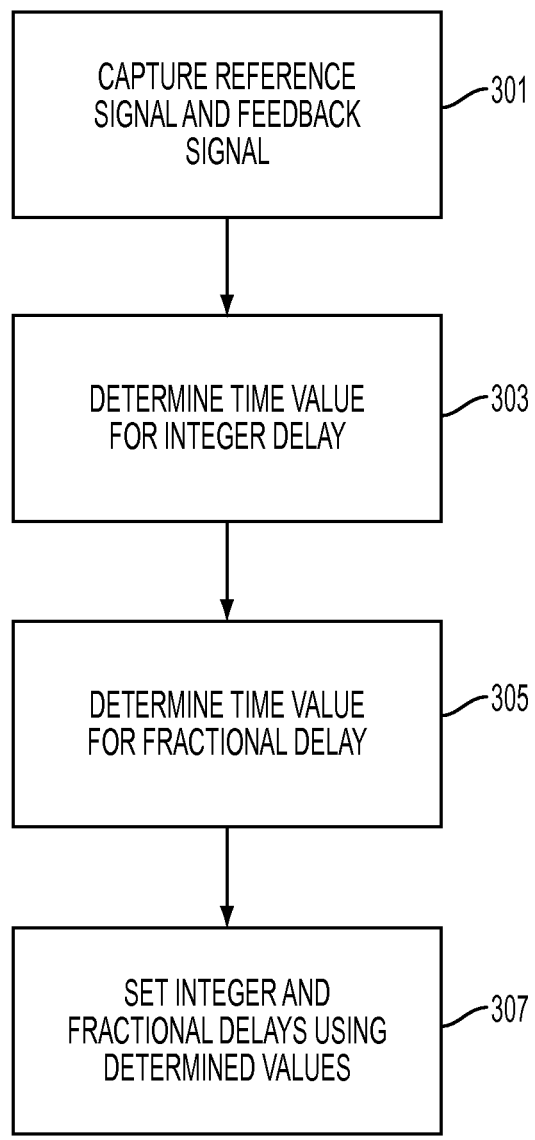
FIG. 3 is a flowchart illustrating a method for determining a time alignment value for an amplifier circuit according to an exemplary embodiment of the present invention.

FIG. 3 is a flowchart illustrating a method for determining a time alignment value for an amplifier circuit according to an exemplary embodiment of the present invention.

Referring to FIG. 3, a baseband (input or reference) signal and a feedback signal are captured by a controller in step 301. In an exemplary implementation, the controller may include a DPD, a DSP, and the like. Based on the captured baseband and feedback signals, the controller determines a time value for an integer delay in step 303. To determine the time value of the integer delay in step 303, the controller may use cross-correlation methods that are known in the art. Also, because the resolution accuracy of the integer delay does not need to be greater than one sample time, the controller does not need to over-sample the captured signals.

In step 305, the controller determines a time value for a fractional delay also using the captured baseband and feedback signals. Exemplary implementations of step 305 will be further discussed with reference to FIGS. 4 and 5 below. In step 307, the controller uses the determined time values to set an integer delay and a fractional delay of the amplifier circuit. Having successfully determined the time values for the integer delay and the fractional delay, the controller ends the procedure of FIG. 3.

Figure 4:
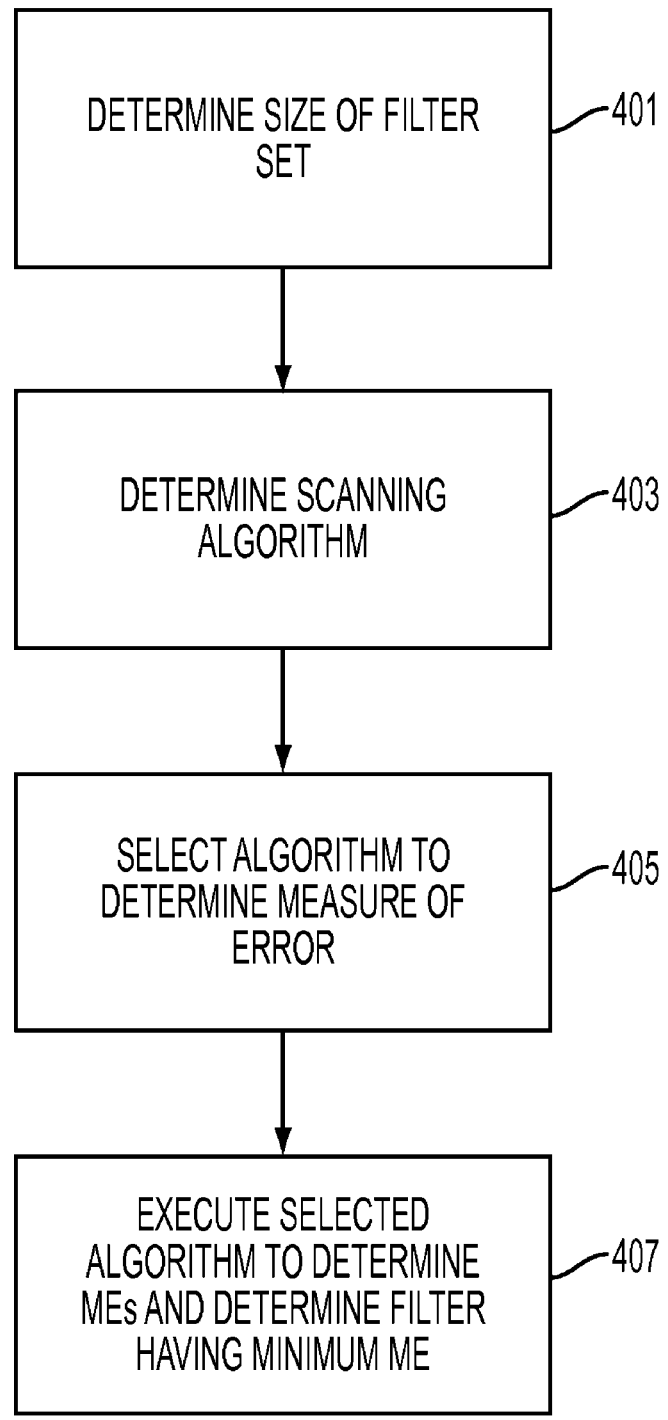
FIG. 4 is a flowchart illustrating a first method for determining a time value of a fractional delay for an amplifier circuit according to an exemplary embodiment of the present invention.

FIG. 4 is a flowchart illustrating a first method for determining a time value of a fractional delay for an amplifier circuit according to an exemplary embodiment of the present invention.

Referring to FIG. 4, the controller determines a size of a filter set available for computing the time value of the fractional delay in step 401. That is, the controller determines the number of different filters in the filter set. In an exemplary implementation, the number of filters in the filter set is 64.

However, this is merely for sake of description and not intended to be limiting. Additionally, the filter set may be stored within a memory or storage unit that is part of the amplifier circuit, in a memory or storage unit that is part of a transmitter in which the amplifier circuit is located, or in a memory or storage unit that is part of a portable terminal in which the transmitter is located.

In step 403, the controller determines a scanning algorithm that will be used to determine which filters will be used for determining a minimum ME. In an exemplary implementation, the controller may determine an ME for each filter included in the filter set and determine a minimum ME from the determined MEs. For example, if there are 64 filters included in the filter set, the controller will determine an ME for each of the 64 filters and determine a minimum from among the 64 determined MEs. Alternatively, the controller may use an algorithm that more selectively chooses filters for which an ME is determined, and selects a minimum ME from among the determined MEs.

In step 405, the controller selects an algorithm with which to determine an ME for each of the chosen filters. According to exemplary embodiments of the present invention, any of the five algorithms described above may be used to determine the ME for each filter. Selection of the algorithm may be made based on various factors such as accuracy and immunity to noise and signal gain variation, complexity and quantity of computation, consistency of results, and the like. Thus, selection of one algorithm versus another may vary based on the individual requirements of each system.

In step 407, the controller executes the selected algorithm for each filter to determine an ME for the filter. That is, the controller executes the selected algorithm for each selected filter and determines an ME for each selected filter. Based on the resultant MEs, the controller determines the filter having the minimum ME as the optimum filter for implementation. Having successfully determined the filter providing the optimum time alignment results for the fractional delay, the controller ends the procedure of FIG. 4.

Figure 5:
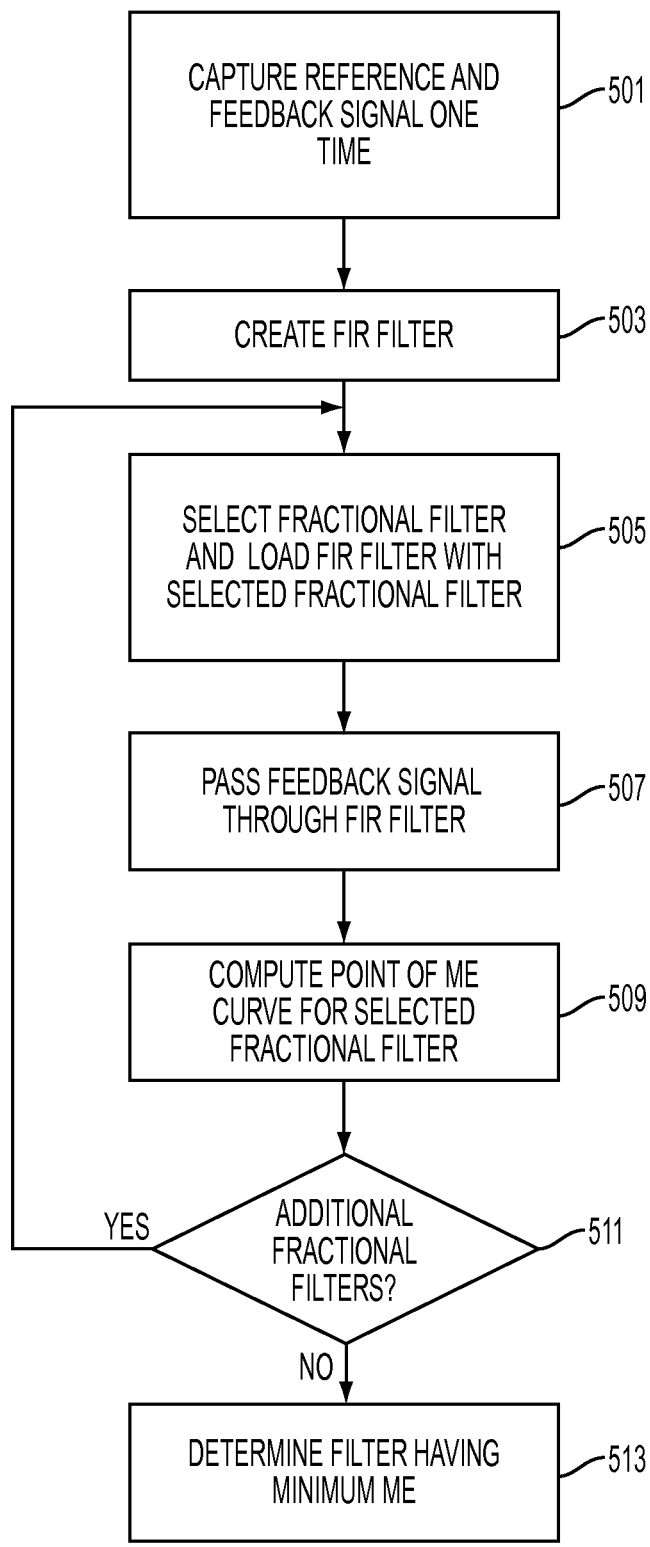
FIG. 5 is a flowchart illustrating a second method for determining a time value of a fractional delay for an amplifier circuit according to an exemplary embodiment of the present invention.

FIG. 5 is a flowchart illustrating a second method for determining a time value of a fractional delay for an amplifier circuit according to an exemplary embodiment of the present invention.

Referring to FIG. 5, the controller performs one capture of the reference and feedback signals in step 501. In step 503, the controller creates a Finite Impulse Response (FIR) filter using software. In step 505, the controller selects a fractional filter from the set of fractional filters for use with the FIR filter and loads the FIR filter with the selected fractional filter. That is, the controller has access to the set of fractional filters that are stored in its memory. The controller selects one of fractional filters for processing with the FIR filter. In step 507, the controller loads the selected fractional filter in the FIR filter and passes the feedback signal through the FIR filter (i.e., convolution operation) to determine an output. In step 509, the output of the FIR filter is used with the reference signal to compute the point of the ME curve corresponding to the particular fractional filter. In more detail, the controller will select one of the five algorithms described above and, using the reference signal, compute the value of the ME curve for the selected fractional filter. In step 511, it is determined if there are fractional filters from the set of fractional filters that remain to be loaded in the FIR filter. If it is determined that there are additional filters, the controller returns to step 505 and executes the subsequent steps using the next fractional filter. On the other hand, if it is determined that all of the fractional filters have been loaded in the FIR filter and used to compute the point of the ME curve corresponding to the particular fractional filter, the controller proceeds to step 513 to determine the fractional filter having the minimum ME value. In more detail, the minimum value corresponds to a specific fractional filter with a specific index and the controller will select the memory address (index) in the FPGA that points to the same fractional filter used by the controller to produce the minimum. Having successfully determined the filter providing the optimum time alignment results for the fractional delay, the controller ends the procedure of FIG. 5

Figure 6:
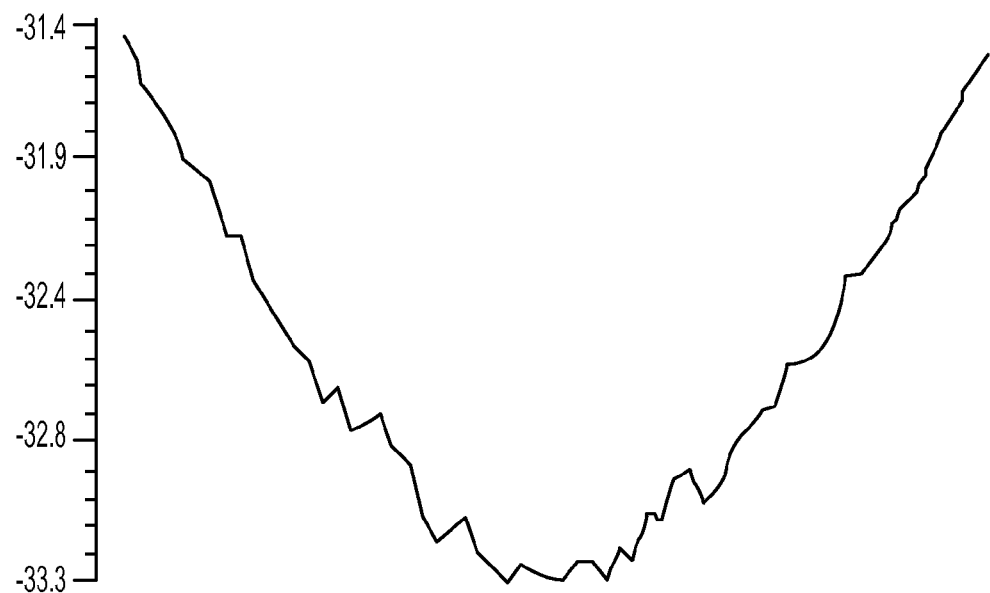
FIG. 6 is a graph illustrating a Measure of Error (ME) using an algorithm for 64 different fractional delay settings used for a loop fractional delay alignment according to an exemplary embodiment of the present invention.
Figure 7:
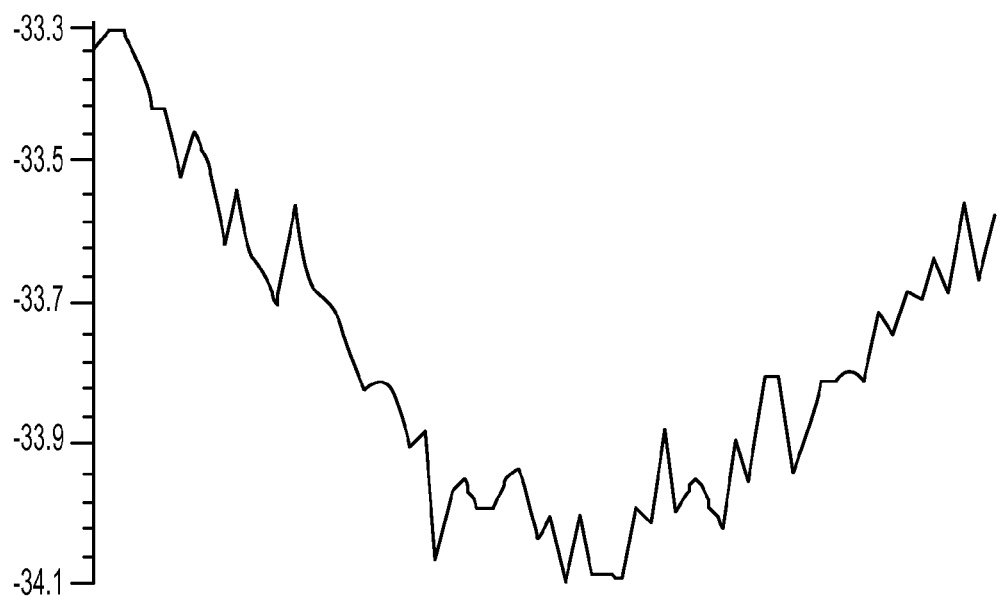
FIG. 7 is a graph illustrating an ME using an algorithm for 64 different fractional delay settings used for an envelope fractional delay alignment according to an exemplary embodiment of the present invention.

Notably, all of FIGS. 3-5 have been described as applied to determine a single integer delay and a single fractional delay. Of course, it is to be understood that the procedures explained in FIGS. 3-5 are equally applicable to determining a first and second integer delay and a first and second fractional delay. For example, in an amplifier circuit using an EER or ET process, the procedure of FIGS. 3-5 could be used to determine a first integer delay and a first fractional delay for a loop alignment as well as a second integer delay and a second fractional delay for an envelope alignment. In such a case that first and second sets of delays are determined, the scanning algorithm and the algorithm used to determine an ME need not be the same for both sets of delays. In other words, the scanning algorithm used to determine the first fractional delay need not be same as the scanning algorithm used to determine the second fractional delay. Similarly, the algorithm used to determine the MEs for the selected filters of the first fractional delay need not be the same as the algorithm used to determine the MEs for the selected filters of the second fractional delay FIG. 6 is a graph illustrating an ME using an algorithm for 64 different fractional delay settings used for a loop fractional delay alignment according to an exemplary embodiment of the present invention. FIG. 7 is a graph illustrating an ME using an algorithm for 64 different fractional delay settings used for an envelope fractional delay alignment according to an exemplary embodiment of the present invention.

Referring to FIGS. 6 and 7, typical plots are provided to illustrate the ME curve computed using an exemplary algorithm for 64 different fractional delay settings. In FIG. 6, an ME plot for loop fractional delay alignment is illustrated, and in FIG. 7, an ME plot for envelope fractional delay alignment is illustrated. As described above, each plot has a bowl shape with one minimum. It is the filter corresponding to the minimum of each curve that is considered the optimum filter and is thus selected as the first and second fractional delays.

In implementation of a power amplifier used for wireless signal transmission, there are at least two issues that can affect the accuracy of the time alignment. The first is the fine alignment resolution. The fine alignment resolution is affected by the algorithm used to find the optimum ME and the hardware (e.g., size of the fractional delay filter set) available. The second is the noise caused by the nonlinear distortion and the analog circuitry. This noise can cause inconsistency from measurement to measurement. However, the above described exemplary embodiments provide an advantage over such concerns.

First, regarding the fine alignment resolution, the oversampling techniques used in the prior are art limited due to practical implementation reasons by the amount of over-sampling. That is, the resolution is limited to $\frac{1}{10}$ of the sampling time. In contrast, exemplary embodiments of the present invention provide algorithms having much better resolutions. For example, in an above described exemplary embodiment using 64 different filters in the filter set, the resolution is $\frac{1}{64}$ of the sample time. Furthermore, even if a filter set contains fewer than 64 filters, the resolution is still better than the prior art. For example, if the filter set contains 32 filters, which is half of that described in the exemplary embodiment above, the resolution is 1/32 of a sample time which is still more than three times the 1/10 resolution achieved by the prior art.

Moreover, actual implementations of the above described exemplary embodiments have produced consistent results in determining an optimum time delay adjustment against noise caused by non-linear distortion. The immunity to noise exhibited by the exemplary embodiments is greater than the immunity provided by the over-sampling techniques, which turn out to be very sensitive to this type of noise.

An additional advantage is that exemplary embodiments of the present invention may be implemented without the need for over-sampling. This is advantageous over the prior art because it does not require such complex computations and requires less memory capacity, both of which contribute to a reduction in the necessary battery power and reduction in the complexity and thus cost of the processing device.

Certain aspects of the present invention may also be embodied as computer readable code on a computer readable recording medium. A computer readable recording medium is any data storage device that can store data, which can be thereafter read by a computer system. Examples of the computer readable recording medium include Read-Only Memory (ROM), Random-Access Memory (RAM), CD-ROMs, magnetic tapes, floppy disks, optical data storage devices, and carrier waves (such as data transmission through the Internet). The computer readable recording medium can also be distributed over network coupled computer systems so that the computer readable code is stored and executed in a distributed fashion. Also, functional programs, code, and code segments for accomplishing the present invention can be easily construed by programmers skilled in the art to which the present invention pertains.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A method for amplifying a transmission signal by a non-linear power amplifier, the method comprising:
   capturing an input signal and a feedback signal;
   determining a first time delay between the input signal and the feedback signal;
   determining, by a first number of filters, a second time delay between the input signal and the feedback signal, the determination of the second time delay having a higher resolution than the determination of the first time delay;
   determining a first Measure of Error (ME) for each of the first number of filters using one equation selected from among the following equations:

$$\min_i ME(i) = \frac{\sum_{m=1}^{N}(R(m)F*(m))}{\sqrt{\left(\sum_{m=1}^{N}|R(m)|^2\right)\left(\sum_{m=1}^{N}|F(m)|^2\right)}} \text{ for } 1 \le i \le S$$

wherein R(m) denotes the input signal, F(m) denotes the feedback signal, S denotes the first number of filters, and N denotes an amount of data captured from the input signal and the feedback signal, $$\min_i ME(i) = \frac{\sum_{m=1}^{N}(R(m)F*(m))}{\sqrt{\left(\sum_{m=1}^{N}|R(m)|^2\right)\left(\sum_{m=1}^{N}|F(m)|^2\right)}} \text{ for } 1 \le i \le S$$

wherein R(m) denotes the input signal, F(m) denotes the feedback signal, S denotes the first number of filters, and N denotes an amount of data captured from the input signal and the feedback signal, $$\min_i ME(i) = \sum_{m=1}^{N}(|I_R(m) - I_F(m)| + |Q_R(m) - Q_F(m)|) \text{ for } 1 \le i \le S$$

wherein R(m) denotes the input signal, F(m) denotes the feedback signal, S denotes the first number of filters, and N denotes an amount of data captured from the input signal and the feedback signal, $$\min_i ME(i) = \sum_{m=1}^{N}(||R(m)| - |F(m)||) \text{ for } 1 \le i \le S$$

wherein R(m) denotes the input signal, F(m) denotes the feedback signal, S denotes the first number of filters, and N denotes an amount of data captured from the input signal and the feedback signal, and $$\min_i ME(i) = \sum_{m=1}^{N}(|\text{angle}(R(m)) - \text{angle}(F(m))|) \text{ for } 1 \le i \le S$$

wherein R(m) denotes the input signal, F(m) denotes the feedback signal, S denotes the first number of filters, and N denotes an amount of data captured from the input signal and the feedback signal; and
   applying the first time delay and the second time delay to temporally align the input signal with the feedback signal.

2. The method of claim 1, further comprising:
   determining a minimum ME from among the determined first MEs; and
   applying the first filter corresponding to the minimum first ME as the second time delay.

3. The method of claim 1, further comprising:
   determining a third time delay between the input signal and the feedback signal;
   determining a fourth time delay between the input signal and the feedback signal, the determination of the fourth time delay having a higher resolution than the determination of the third time delay; and
   applying the third time delay and the fourth time delay to temporally align an envelope signal with a forward path signal.

4. The method of claim 3, further comprising determining a number of second filters with which to determine the fourth time delay.

5. The method of claim 4, further comprising:
   determining a first ME for each of the second filters;
   determining a minimum ME from among the determined second MEs; and applying the second filter corresponding to the minimum second ME as the fourth time delay.

6. The method of claim 1, further comprising:
creating a Finite Impulse Response (FIR) filter;
sequentially loading the FIR filter with each of the first filters;
sequentially passing the captured feedback signal through the FIR filter loaded with the first filters to determine an output corresponding to each of the first filters;
determining a ME corresponding to each of the first filters using the output of the FIR filter and the input signal; and
determining a minimum ME from among the determined MEs.

7. An apparatus for amplifying a transmission signal, the apparatus comprising:
a controller for capturing an input signal and a feedback signal, for determining a first time delay between the input signal and the feedback signal, and for determining a second time delay between the input signal and the feedback signal, the determination of the second time delay having a higher resolution than the determination of the first time delay;
a first integer delay for applying the first time delay; and
a first fractional delay comprising a first number of filters for applying the second time delay,
wherein the first integer delay and the first fractional delay respectively apply the first time delay and the second time delay to temporally align the input signal with the feedback signal,
wherein the controller determines a first Measure of Error (ME) for each of the first number of filters using one equation selected from among the following equations:

$$\min_i ME(i) = \frac{\sum_{m=1}^{N}(R(m)F*(m))}{\sqrt{\left(\sum_{m=1}^{N}|R(m)|^2\right)\left(\sum_{m=1}^{N}|F(m)|^2\right)}} \text{ for } 1 \le i \le S$$

wherein R(m) denotes the input signal, F(m) denotes the feedback signal, S denotes the first number of filters, and N denotes an amount of data captured from the input signal and the feedback signal, $$\min_i ME(i) = \frac{\sum_{m=1}^{N}(R(m)F*(m))}{\sqrt{\left(\sum_{m=1}^{N}|R(m)|^2\right)\left(\sum_{m=1}^{N}|F(m)|^2\right)}} \text{ for } 1 \le i \le S$$

wherein R(m) denotes the input signal, F(m) denotes the feedback signal, S denotes the first number of filters, and N denotes an amount of data captured from the input signal and the feedback signal, $$\min_i ME(i) = \sum_{m=1}^{N} (|I_R(m) - I_F(m)| + |Q_R(m) - Q_F(m)|) \text{ for } 1 \le i \le S$$

wherein R(m) denotes the input signal, F(m) denotes the feedback signal, S denotes the first number of filters, and N denotes an amount of data captured from the input signal and the feedback signal, $$\min_i ME(i) = \sum_{m=1}^{N} (||R(m)| - |F(m)||) \text{ for } 1 \le i \le S$$

wherein R(m) denotes the input signal, F(m) denotes the feedback signal, S denotes the first number of filters, and N denotes an amount of data captured from the input signal and the feedback signal, and $$\min_i ME(i) = \sum_{m=1}^{N} (|\text{angle}(R(m)) - \text{angle}(F(m))|) \text{ for } 1 \le i \le S$$

wherein R(m) denotes the input signal, F(m) denotes the feedback signal, S denotes the first number of filters, and N denotes an amount of data captured from the input signal and the feedback signal.

8. The apparatus of claim 7, wherein the controller further determines a minimum ME from among the determined first MEs, and wherein the first fractional delay uses the first filter corresponding to the minimum first ME as the second time delay.

9. The apparatus of claim 7, wherein the controller determines a third time delay between the input signal and the feedback signal and determines a fourth time delay between the input signal and the feedback signal, the determination of the fourth time delay having a higher resolution than the determination of the third time delay, and wherein
a second integer delay applies the third time delay; and
a second fractional delay applies the second time delay,
wherein the second integer delay and the second fractional delay respectively apply the third time delay and the fourth time delay to temporally align an envelope signal with a forward path signal.

10. The apparatus of claim 9, wherein the controller determines a number of second filters with which to determine the fourth time delay.

11. The apparatus of claim 10, wherein the controller determines a second ME for each of the second filters and determines a minimum ME from among the determined second MEs, and wherein the second fractional delay uses the second filter corresponding to the minimum second ME as the fourth time delay.

12. The apparatus of claim 7 wherein the controller creates a Finite Impulse Response (FIR) filter, sequentially loads the FIR filter with each of the first filters, sequentially passes the captured feedback signal through the FIR filter loaded with the first filters to determine an output corresponding to each of the first filters, determines a ME corresponding to each of the first filters using the output of the FIR filter and the input signal, and determines a minimum ME from among the determined MEs.

* * * * *